United States Patent
Lawson et al.

(10) Patent No.: US 7,492,221 B2
(45) Date of Patent: Feb. 17, 2009

(54) POWER CONVERSION REGULATOR WITH EXPONENTIATING FEEDBACK LOOP

(75) Inventors: Thomas E. Lawson, Malvern, PA (US); William H. Morong, Norristown, PA (US)

(73) Assignee: Lawson Labs, Inc., Malvern, PA (US)

( * ) Notice: Subject to any disclaimer, the term of this patent is extended or adjusted under 35 U.S.C. 154(b) by 99 days.

(21) Appl. No.: 11/593,698

(22) Filed: Nov. 6, 2006

(65) Prior Publication Data
US 2007/0115060 A1 May 24, 2007

Related U.S. Application Data

(60) Provisional application No. 60/734,068, filed on Nov. 7, 2005, provisional application No. 60/739,564, filed on Nov. 23, 2005, provisional application No. 60/771,769, filed on Feb. 9, 2006, provisional application No. 60/774,413, filed on Feb. 17, 2006.

(51) Int. Cl.
*H03F 1/36* (2006.01)
(52) U.S. Cl. .......................................... 330/110; 330/69
(58) Field of Classification Search .................. 330/110, 330/69, 252, 260; 327/560, 563
See application file for complete search history.

(56) References Cited

U.S. PATENT DOCUMENTS

| | | | | |
|---|---|---|---|---|
| 3,663,833 A | * | 5/1972 | Pao et al. | 327/347 |
| 3,676,595 A | * | 7/1972 | Dolansky et al. | 704/276 |
| 5,276,407 A | | 1/1994 | Mead et al. | |
| 6,369,618 B1 | * | 4/2002 | Bloodworth et al. | 327/103 |
| 6,486,711 B1 | * | 11/2002 | Tsay et al. | 327/96 |
| 7,019,565 B2 | * | 3/2006 | Tam et al. | 327/122 |

OTHER PUBLICATIONS

International Searching Authority, International Search Report, May 14, 2008.

* cited by examiner

*Primary Examiner*—Henry K Choe
(74) *Attorney, Agent, or Firm*—Rudoler & DeRosa LLC (57) ABSTRACT

A feedback control loop around a gain element controls the output signal of said gain element responsive to an input or reference signal, and is additionally responsive to a non-linear feedback signal. The feedback loop of this invention comprises computation means for exponentiating a signal representing the output of the gain element to generate said non-linear feedback signal. The control loop of invention provides exceptional transient response when used for driving reactive loads.

10 Claims, 10 Drawing Sheets

POWER CONVERSION REGULATOR WITH EXPONENTIATING FEEDBACK LOOP

CROSS-REFERENCE TO RELATED APPLICATIONS

The present application claims the benefit of U.S. Provisional Application Nos. 60/734,068, filed on Nov. 7, 2005, 60/739,564 filed on Nov. 23, 2005, 60/771,769 filed on Feb. 9, 2006, and 60/774,413 filed on Feb. 17, 2006, all of which are incorporated herein by reference.

STATEMENT REGARDING FEDERALLY SPONSORED RESEARCH OR DEVELOPMENT

The present invention was not developed with the use of any Federal Funds, but was developed independently by the inventors.

BACKGROUND OF THE INVENTION

It is often desirable to drive a capacitance quickly and accurately to a desired voltage and to maintain that voltage despite sudden load and line changes. This need is particularly acute in the output of power supplies, but also arises in precision applications such as driving the highly-capacitive inputs of some analog-to-digital converters. It is common practice to obtain low instantaneous output impedance using large capacitors. With descending frequency, capacitive reactance increases, and at some band of frequencies one augments the susceptance of the capacitor using a control loop around an amplifier or other gain block. The amplifier is commonly responsive to the difference between a signal representing desired output voltage and actual output voltage. The problem that arises with this classic control loop is that somewhere in the bandpass of the amplifier there exists a peak accompanied by large and abrupt phase changes with frequency. This happens because a pole is formed by the amplifier output impedance and the capacitance being driven. This pole attenuates control loop feedback at higher frequencies where the amplifier still has significant gain. The transient dynamics of the classic control loop often suffer from this problem, and some loops even oscillate unless carefully adjusted. The classic dilemma is that with large output capacitors one can obtain low instantaneous output impedance, but only by compromising the ability of the control loop to respond quickly to line and load changes. This problem is so pervasive that one semiconductor data book, "Amplifiers, Book 1 of 2" of the 2004 Linear Family Databooks, by Linear Technology Corp., of Milpitas, Calif., devotes pages 40, 41 and 42 to a list of approximately 144 amplifiers, called "C-Load OP AMPS", especially designed for driving capacitive loads. The problem with the classic loop arises from feeding back within the control loop a linear representation of output voltage that mismatches in incremental shape the energy demand of output capacitance in the event of a requirement to respond to change.

BRIEF DESCRIPTION OF THE INVENTION

A feedback control loop around a gain element or amplifier controls the output signal of said amplifier responsive to an input or reference signal, and additionally to a non-linear feedback signal derived from the output signal of the amplifier. Said non-linear feedback signal is generated by a feedback network that exponentiates said output signal. Exponentiation shapes the incremental response of said feedback loop to provide error correction in proportion to the energy requirement of a reactive load when a change occurs. Exponentiation according to this invention substantially eliminates from computation the usual pole that plagues prior art attempts to compensate amplifiers and power regulators. Exponentiating computation of this invention provides incremental energy balance in the correction of any output errors. This invention thus provides exceptional transient response when used for driving reactive loads.

DETAILED DESCRIPTION OF THE INVENTION

The feedback loop of this invention is shown embodied in several types of amplifiers and a power regulator. The crucial difference between this invention and prior art is provision of means for exponentiating its feedback signal. It often convenient to exponentiate by the power of two, that is to square the feedback. However, exponents greater than two provide even more correction that the exponent two, and exponents between unity and two provide some advantage over unity, the desired transient response being more easily attained as one moves from unity toward the exponent two, or greater. The gain block of this invention may be of conventional character, the amplifiers used in most of the following embodiments being ordinary operational amplifiers with an open-loop gain of $10^6$, a gain-bandwidth of 10 MHz, and a slew rate of 10V/μS.

The fundamental equation for energy in a capacitor is:

$$KE = (C*E^2)/2$$

where: KE is kinetic energy in joules
E is voltage in volts
C is capacitance in farads This equation being non-linear, it can be understood that linear error correction in a feedback loop poorly matches the energy demands of a capacitance when voltage change must occur, or be prevented. However, squaring a signal representing output voltage shapes error response to achieve incremental energy balance.

Figure 1:
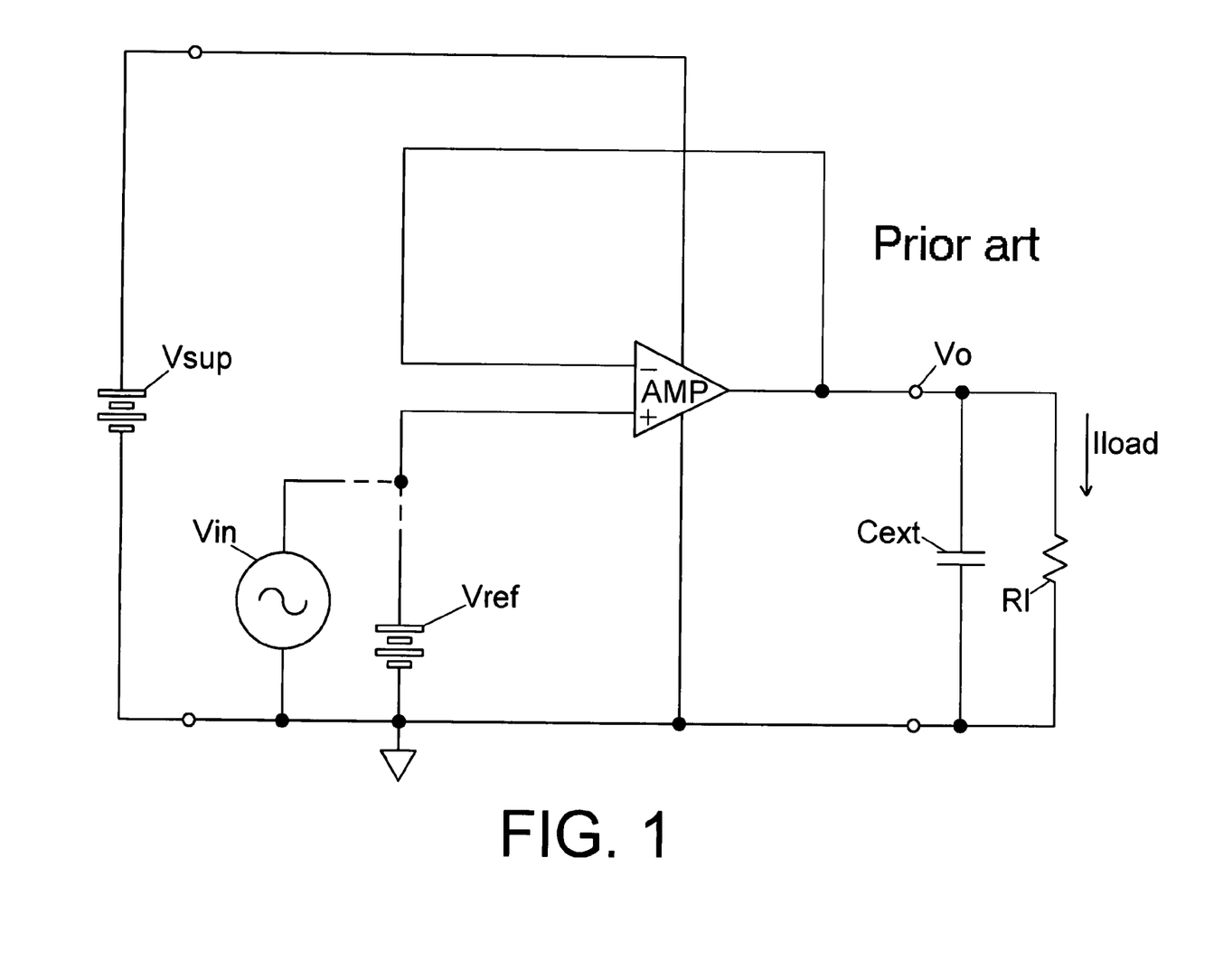
FIG. 1 illustrates a prior-art voltage feedback control-loop.

FIG. 1 illustrates a prior-art voltage feedback control-loop of entirely conventional character. This figure illustrates an amplifier driving a capacitive load responsively to an input voltage Vin. This figure also represents the more static case of a voltage regulator wherein an amplifier or gain-block drives an output comprising capacitance responsively to a reference voltage Vref. In either case, the source of power is Vsup. The term input signal is used to describe either Vin or Vref.

The term exponentiating means to take a signal to a power. So, for example, exponentiating a signal by a factor two is to take the square of the signal (i.e. multiplying the signal by itself) and exponentiating a number by a factor three is take its cube. Exponentiating N by a factor 1.3 would mean $N^{1.3}$ (N to the 1.3 power). Implementing this function in real circuits may be accomplished by either analog or digital circuits. Reference to exponentiating a signal by a particular factor is meant to be approximate.

In the case of a voltage regulator, the gain block often comprises a voltage amplifier followed by a transistor capable of supplying moderately large currents. Feedback loop operation is usually accomplished by using the amplifier AMP substantially to annihilate any voltage difference between its input terminals "−" and "+". Since the amplifier is usually at least piecewise linear, the voltage correction applied to output capacitor Cext is proportional to the difference between Vin or Vref and Vo, the output voltage. Since the output of the amplifier is usually resistive, and energy delivered to Cext is substantially proportional to error correction voltage, there exists a mismatch between the substantially exponential shape of the incremental charging current needed by Cext and the substantially linear correction generated. Another way of expressing this difficulty is to say that the output resistance of the amplifier and Cext form a "pole." If one persists in proportional voltage feedback, it becomes necessary to "compensate" this pole to ameliorate its effects upon transient response, or even to prevent oscillations. The vexing problem with the output pole of the prior art is that it is not readily annihilated with additional amplifier gain-bandwidth; the latter may actually provoke oscillations. It is, rather, responsive to reduction of the actual open-loop, not fed-back or virtual, output impedance of AMP, which usually may be reduced only by larger output structures that often consume relatively large amounts of power. The amplifier used for this figure is sufficiently stable to operate without external compensation and without oscillation. Rext represents a substantially DC load that may dynamically change. In this prior-art embodiment, an ordinary operational amplifier with an open-loop gain of 10^6, a gain-bandwidth of 10 MHz, and a slew rate of 10V/μS is used. Less ringing could be attained with compensation, but at the expense of slower transient response.

Figure 2:
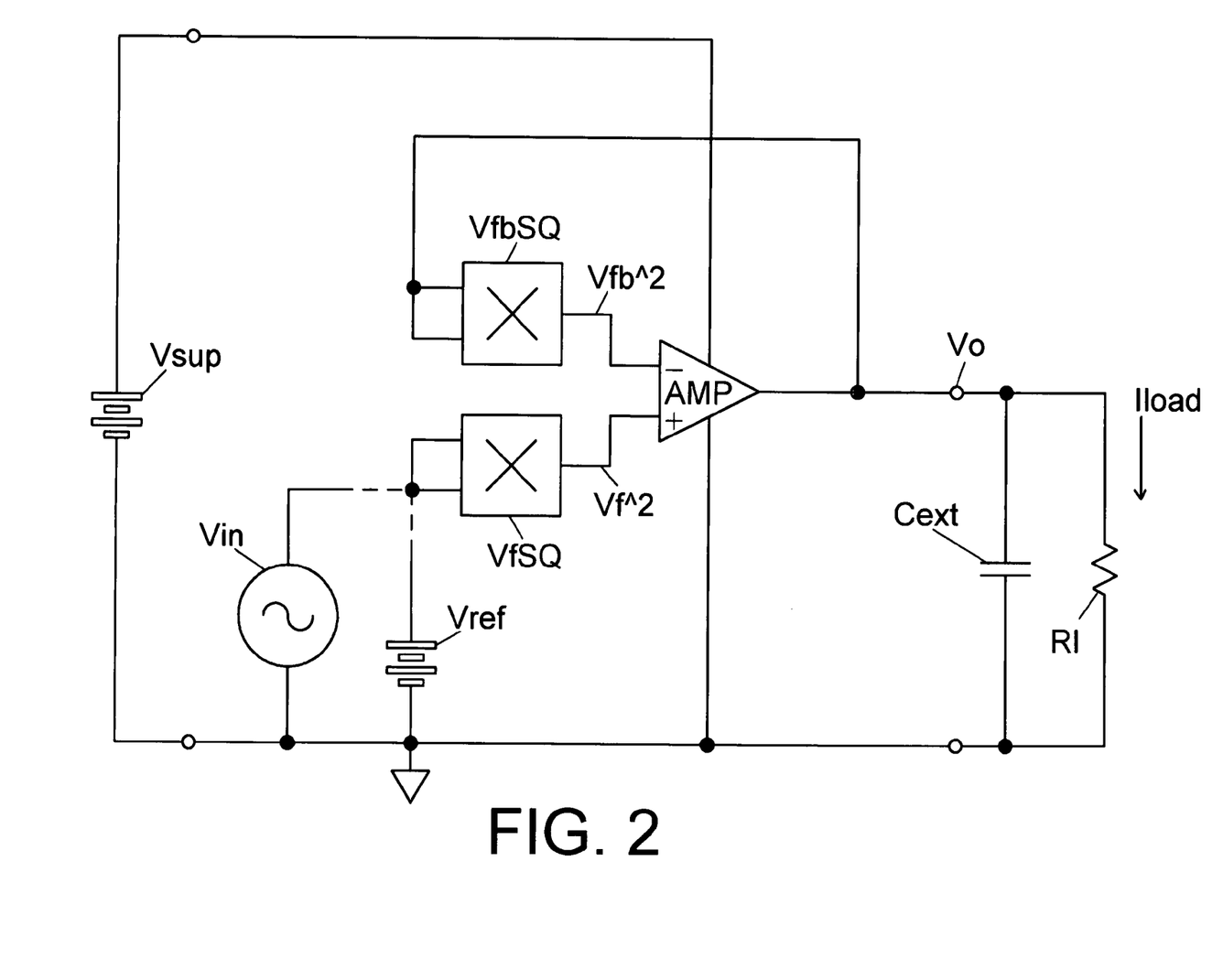
FIG. 2 shows an exponentiating feedback control-loop according to the present invention.

FIG. 2 shows an exponentiating feedback control-loop according to the present invention. In this figure the function of Vsup, Vin, Vref, Cext, and Rext, and AMP are identical to the prior art. Where this embodiment departs from prior art is in the inclusion of squaring multiplier, VfbSQ in the feedback loop of AMP. If this embodiment is to be used as an amplifier, another squaring multiplier, VfSQ, should be applied in the forward path between Vin or Vref and the "+" input of AMP to obtain full correction of the error voltage between the inputs of AMP. Partial correction may be obtained if VfSQ is omitted. In the voltage regulator case, since Vref hopefully is stable, VfSQ would usually be omitted and a properly scaled constant signal representing the square of Vref would be applied to the "+" input of AMP. Correction may be obtained using exponents other than the 2.0 exponent shown in this embodiment. Higher exponents produce a higher gain of correction, and lower exponents produce less than full correction. Exponents less than 1.1 produce substantially prior-art results. In this embodiment of the present invention, an ordinary operational amplifier with an open-loop gain of 10^6, a gain-bandwidth of 10 MHz, and a slew rate of 10V/μS is used.

Figure 3:
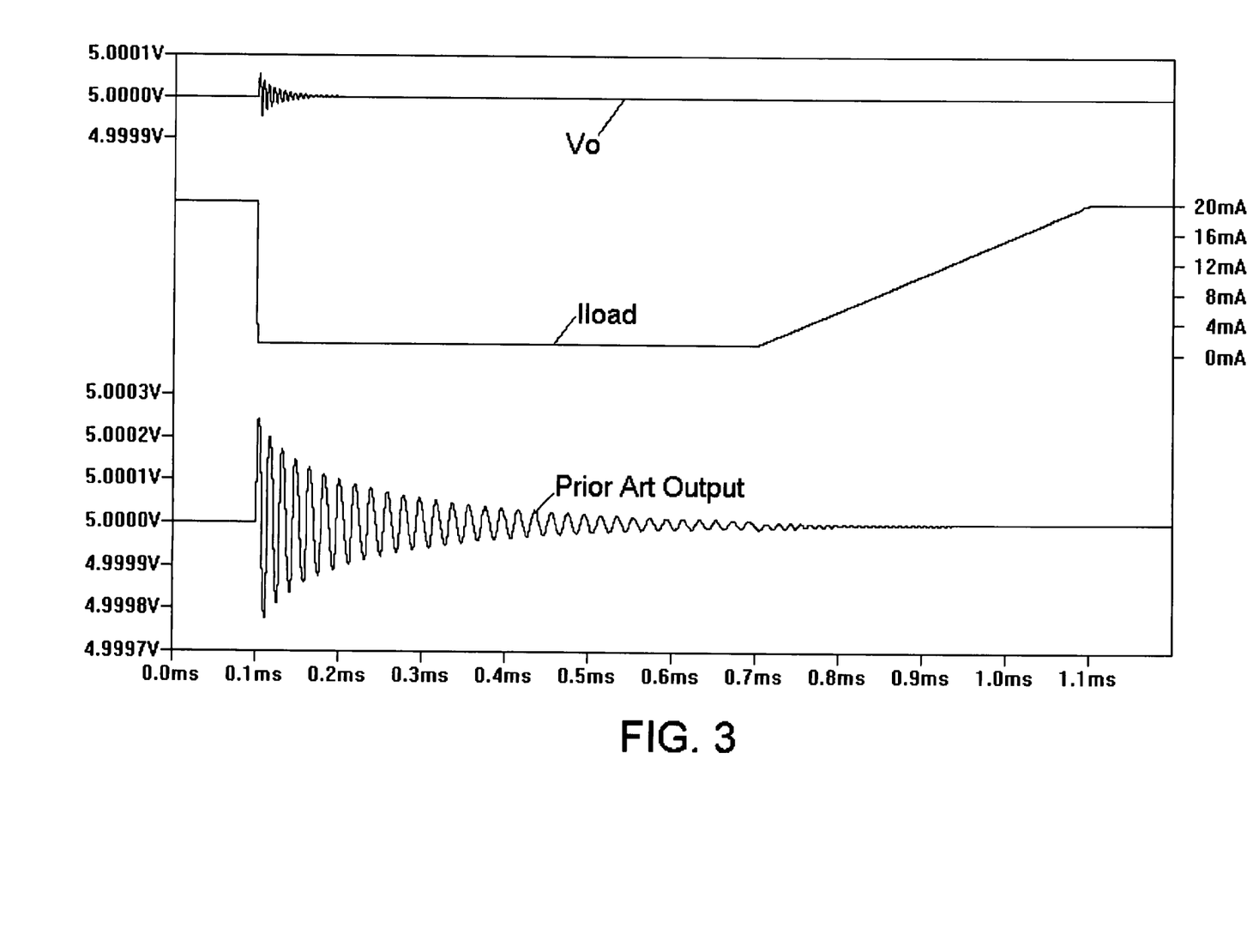
FIG. 3 shows the output voltage waveform of an exponentiating feedback control-loop according to the present invention being exercised by a load change. For comparison, it also shows the response of the prior-art control loop of FIG. 1.
Figure 6:
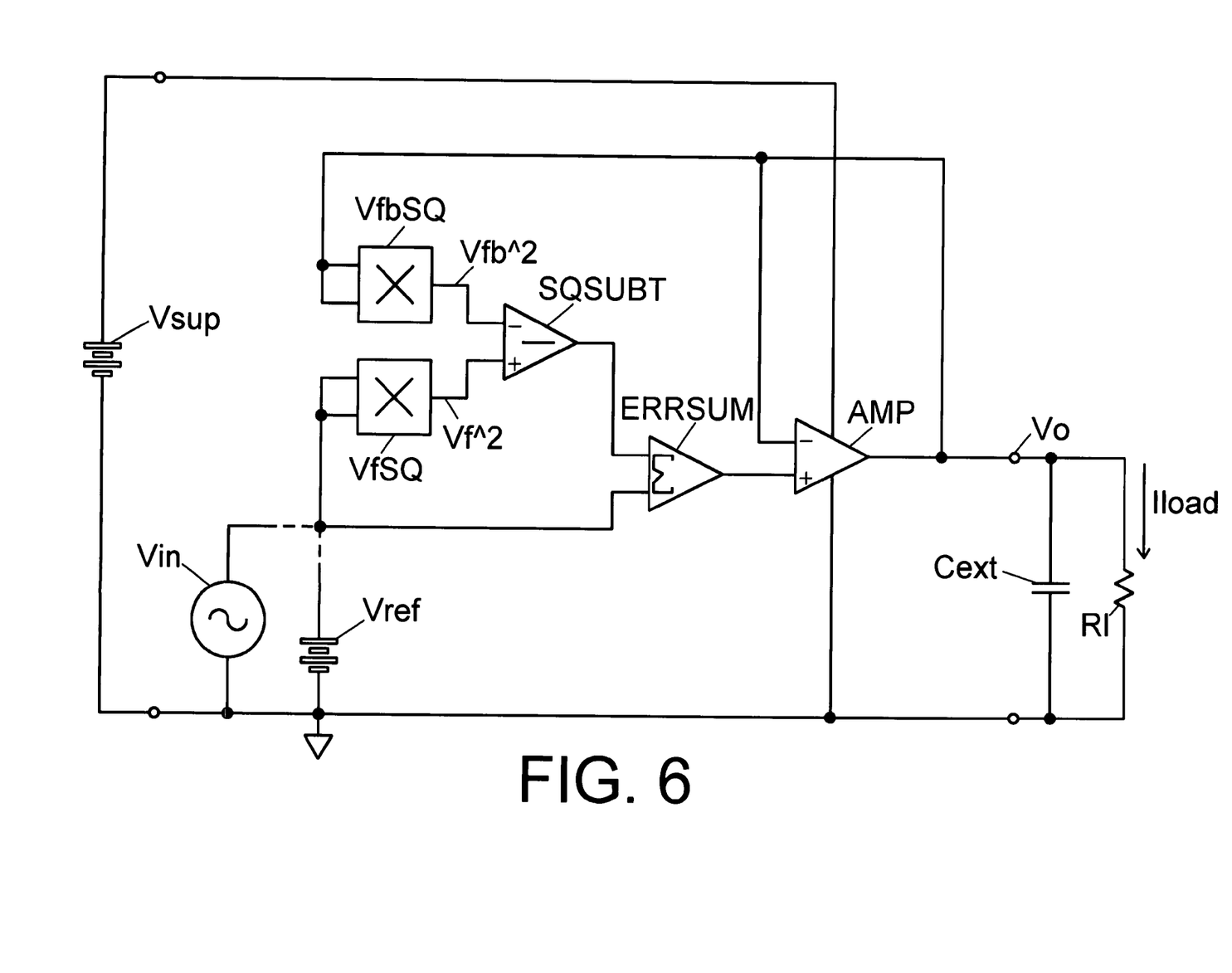
FIG. 6 shows another embodiment of an exponentiating feedback control-loop according to the present invention, wherein an error voltage is summed with a reference voltage to apply exponentiated feedback.
Figure 7:
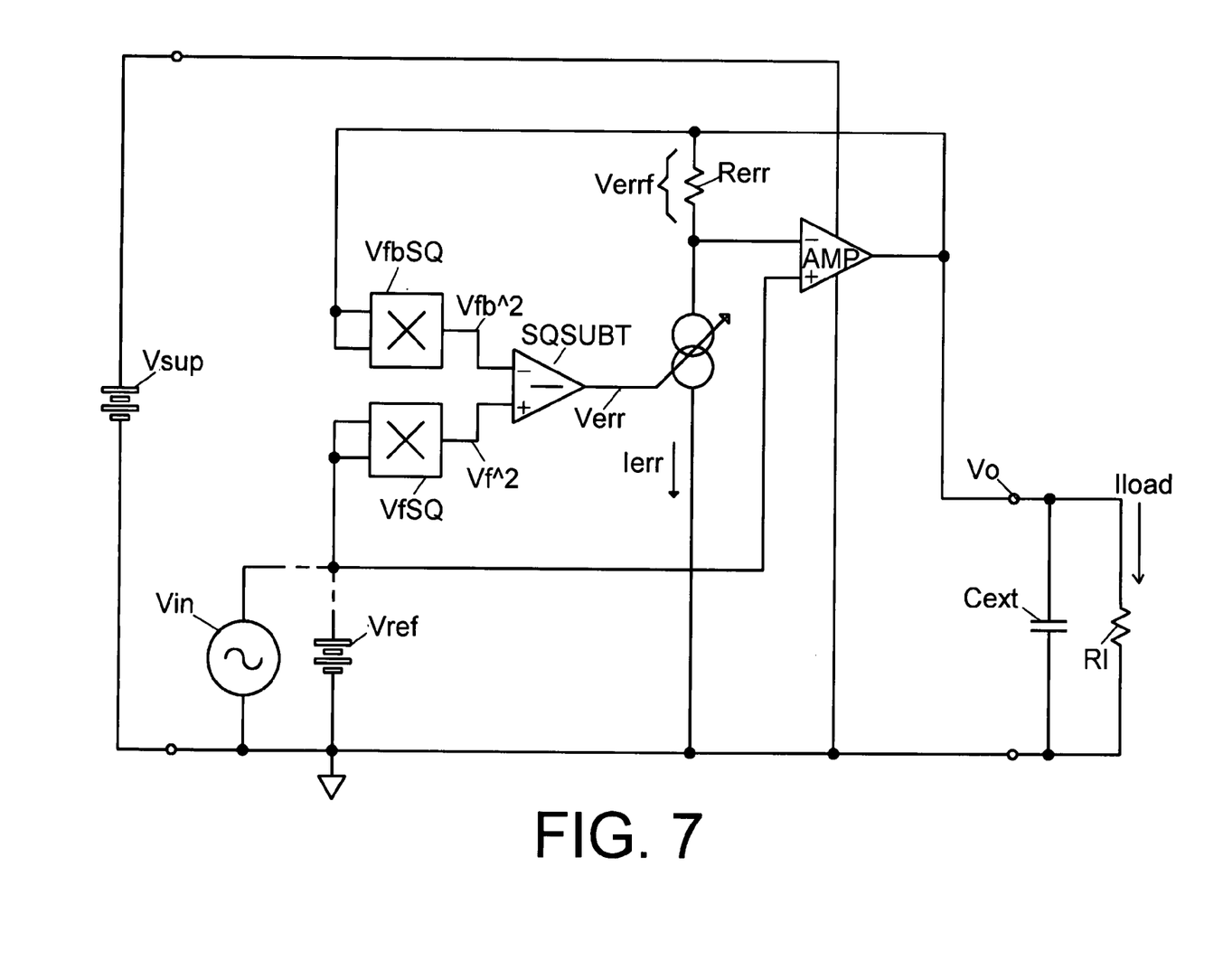
FIG. 7 shows another embodiment of an exponentiating feedback control-loop according to the present invention, wherein an error current develops an error voltage in series with the feedback signal of the control-loop.

FIG. 3 shows the output waveform of the embodiment of FIG. 2 when exercised by a load current, Iload, that varies between about 1 mA and 20 mA. For comparison, it also shows the voltage output of the prior-art feedback loop of FIG. 1 Since the behavior of the embodiments of FIGS. 6 and 7 are substantially the same as that of FIG. 2, the upper trace, marked Vo, also represents the behavior of FIGS. 6 and 7. In the lower, prior art output, starting at about 0.1 mS, the effect of the pole formed by the output impedance of AMP and Cext is seen as a not-very-damped ring with a natural frequency of about 65 KHz. A much smaller disturbance can be detected at the cusp of load current at about 0.7 mS. The trace marked Vo, the output of the present invention also has a ring starting at about 0.1 mS, but it is much shorter in duration and of higher frequency. If AMP were one of the commonly-available fast operational amplifiers rather than an ordinary one, this ring of Vo would substantially disappear, but less could be learned about the feedback loop of the present invention from this figure. What is happening here is that whilst exponentiated feedback substantially negates the effect of the pole formed by the output impedance of AMP and Cext, it does not negate the internal pole formed by the finite gain-bandwidth product of AMP. The output pole of the prior art is persistent, not yielding to the brute force of gain-bandwidth, so additional gain-bandwidth in a prior art loop may do little for its dynamics. However in the feedback loops of the present invention shown in FIGS. 2, 6, and 7, the gain-bandwidth product of AMP is the dominant pole, so readily-available fast operational amplifiers may be used to set this pole so high in frequency that its effect on desired operation is insignificant. It should be noted that an exponentiating feedback loop does not annihilate poles formed by the multiplier, or other exponentiating means, itself. Such multipliers as the Analog Devices AD734 have excellent high frequency response if that is needed for a particular application of the present invention. In a monolithic embodiment, it would be relatively easy and inexpensive to include within an amplifier the structures necessary to square its own inputs and thus to practice this invention.

FIG. 3, as well as all other graphs showing results of the invention, are generated using SPICE, a well known computer simulation tool for electrical circuits.

Figure 4:
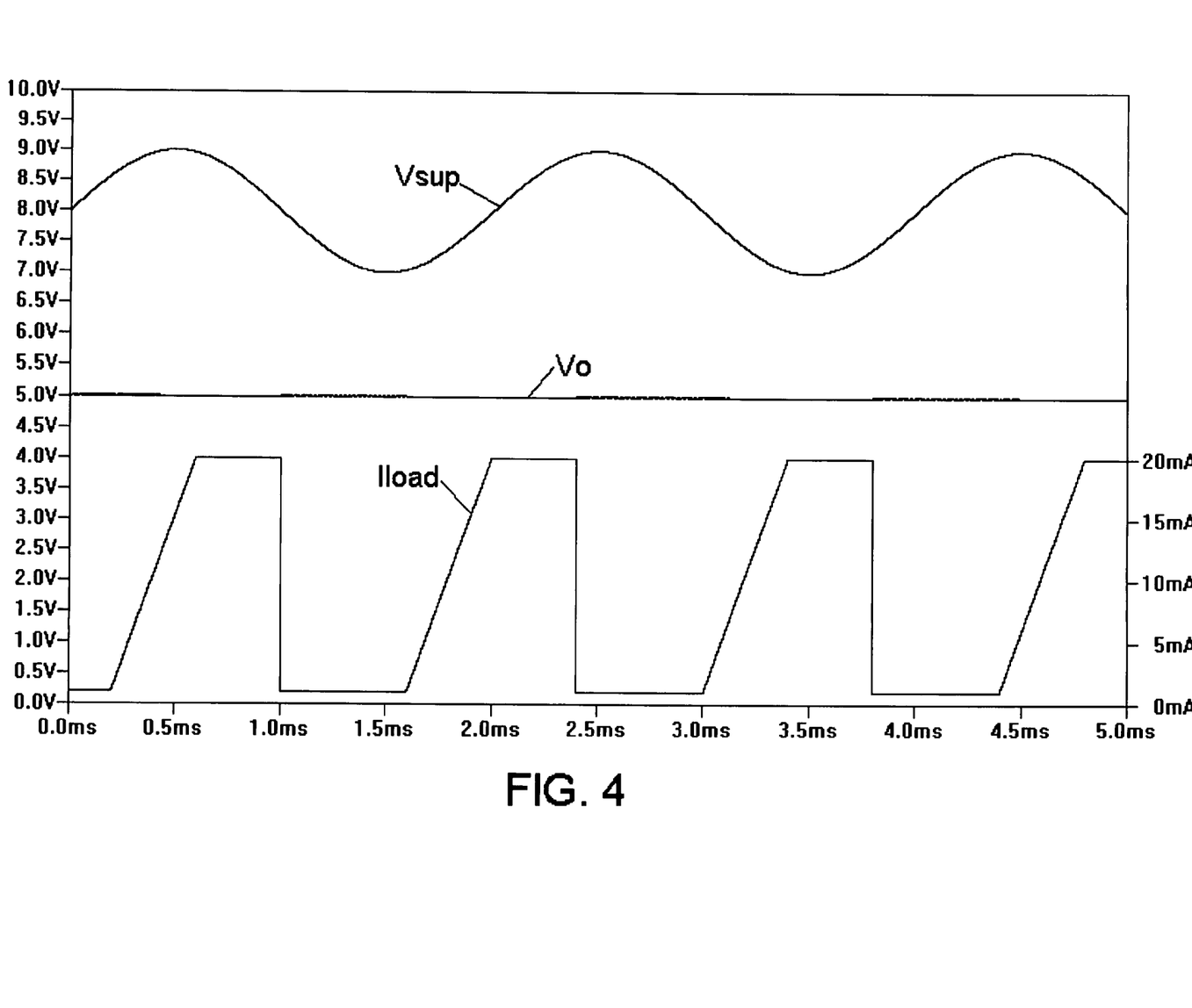
FIG. 4 shows the output voltage waveform of an exponentiating feedback control-loop according to the present invention being exercised by a supply voltage change and a load change.

The term amplifier is used for each of the embodiments described herein and is meant to include power supplies, FIG. 4 shows the power supply rejection of the embodiments of FIGS. 2, 6, 7, and also of prior-art embodiment FIG. 1. All that is shown here is that operational amplifiers have power supply rejection, whether used to practice prior-art or to practice this invention.

Figure 5:
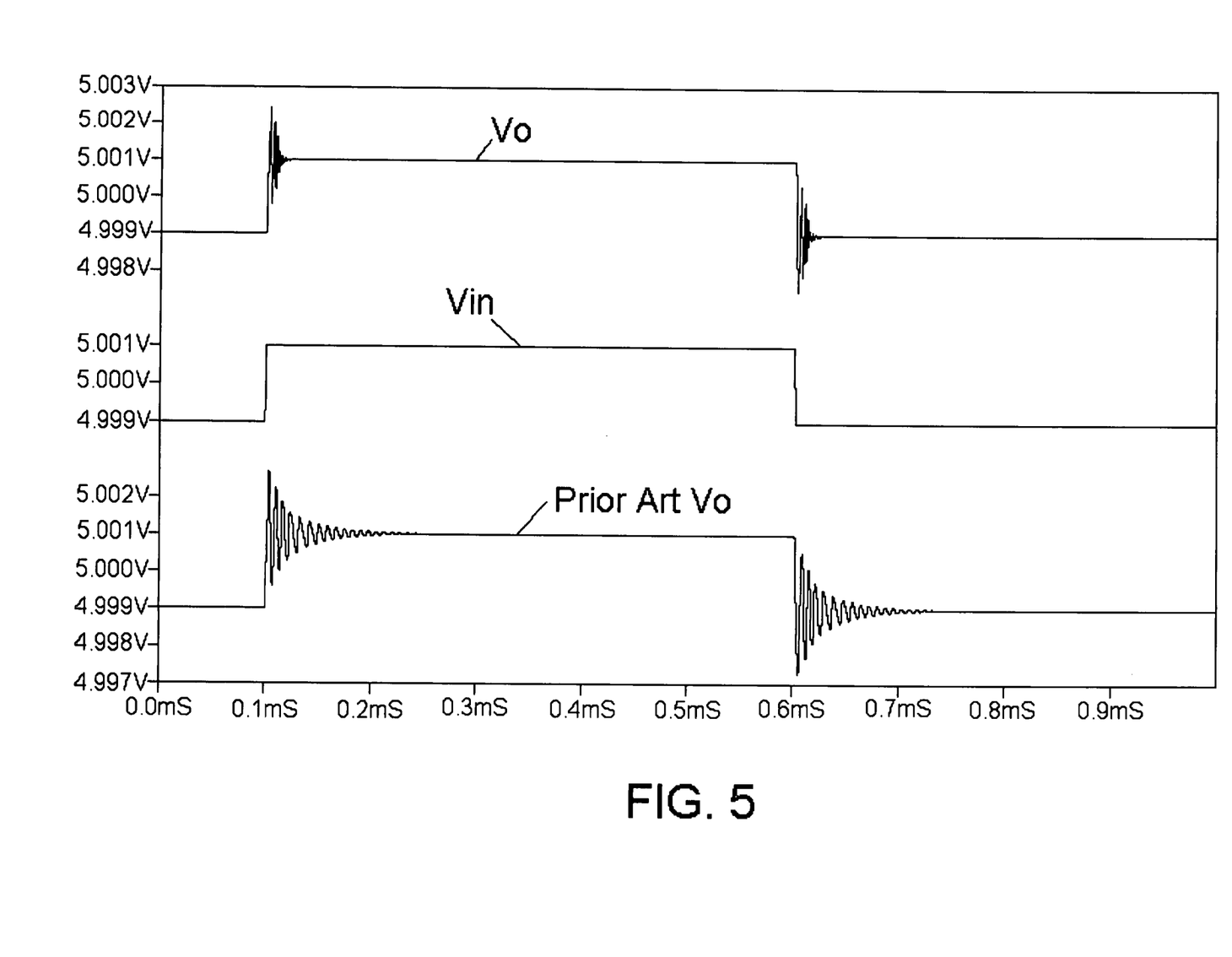
FIG. 5 shows the output voltage waveform of an exponentiating feedback control-loop according to the present invention being exercised by an input voltage change. For comparison, it also shows the response of the prior-art control loop of FIG. 1.

FIG. 5 shows the embodiment of FIG. 2 operating as an amplifier driving a capacitive load. Here again, the ringing on Vo, the output of this invention, is of shorter duration and of higher frequency than the ringing on Prior Art Vo, the output of the embodiment of FIG. 1. Both are responding to a changing input voltage, Vin.

FIG. 6 shows an embodiment of the present invention functionally equivalent to that of FIG. 2, despite being of different structure.

This embodiment is less demanding of gain in AMP than that of FIG. 2, as is illustrated by the connection of AMP as a voltage follower, which may better suit it to some applications where available gain is limited by practical considerations. Adding a local feedback network to take additional gain from AMP increases the precision with which this loop annihilates error. In this embodiment the function of Vsup, Vin, Vref, Cext, and Rext, VfbSQ, and VfSQ are substantially the same as in FIG. 2. Subtractor SQSUBT replaces the function of AMP in seeking the difference of exponentiated feedback and exponentiated feed-forward signals. Were VfbSQ, VfSQ, and SQSUBT eliminated, Vin or Vref would pass substantially unchanged through summer ERRSUM to form a voltage feedback loop equivalent to prior-art. However, the connection of the output of SQSUBT to ERRSUM puts, in effect, the output of SQSUBT in series cascade between Vin or Vref and the "+" input of AMP. Thus Vo can equal Vin or Vref only if the output of SQSUBT is zero. The feedback through SQSUBT is so poled as to tend to annihilate the output thereof. The behavior of this embodiment, using the same operational amplifiers, is substantially indistinguishable from that of FIG. 2.

FIG. 7 shows an embodiment of the present invention equivalent to that of FIG. 6. This embodiment is also less demanding of gain in AMP than that of FIG. 2, as is illustrated by the connection of AMP as a modified voltage follower. In this embodiment the function of Vsup, Vin, Vref, Cext, and Rext, VfbSQ, VfSQ, and SQSUBT are substantially the same as in FIG. 6. In this embodiment, summer ERRSUM is replaced by a controllable current sink Ierr, which draws a current Ierr through a resistor Rerr. The voltage across Rerr is equivalent to the output of ERRSUM of FIG. 6, and could be put in series cascade between Vin or Vref and the "+" input of AMP. The same effect is obtained by placing Rerr, as shown, in the local feedback loop of AMP. This embodiment may be advantageous when the chosen exponentiator delivers a current, rather than a voltage, output. The behavior of this embodiment, using the same operational amplifiers, is substantially indistinguishable from the behavior of the embodiments of FIGS. 2 and 6.

Figure 8:
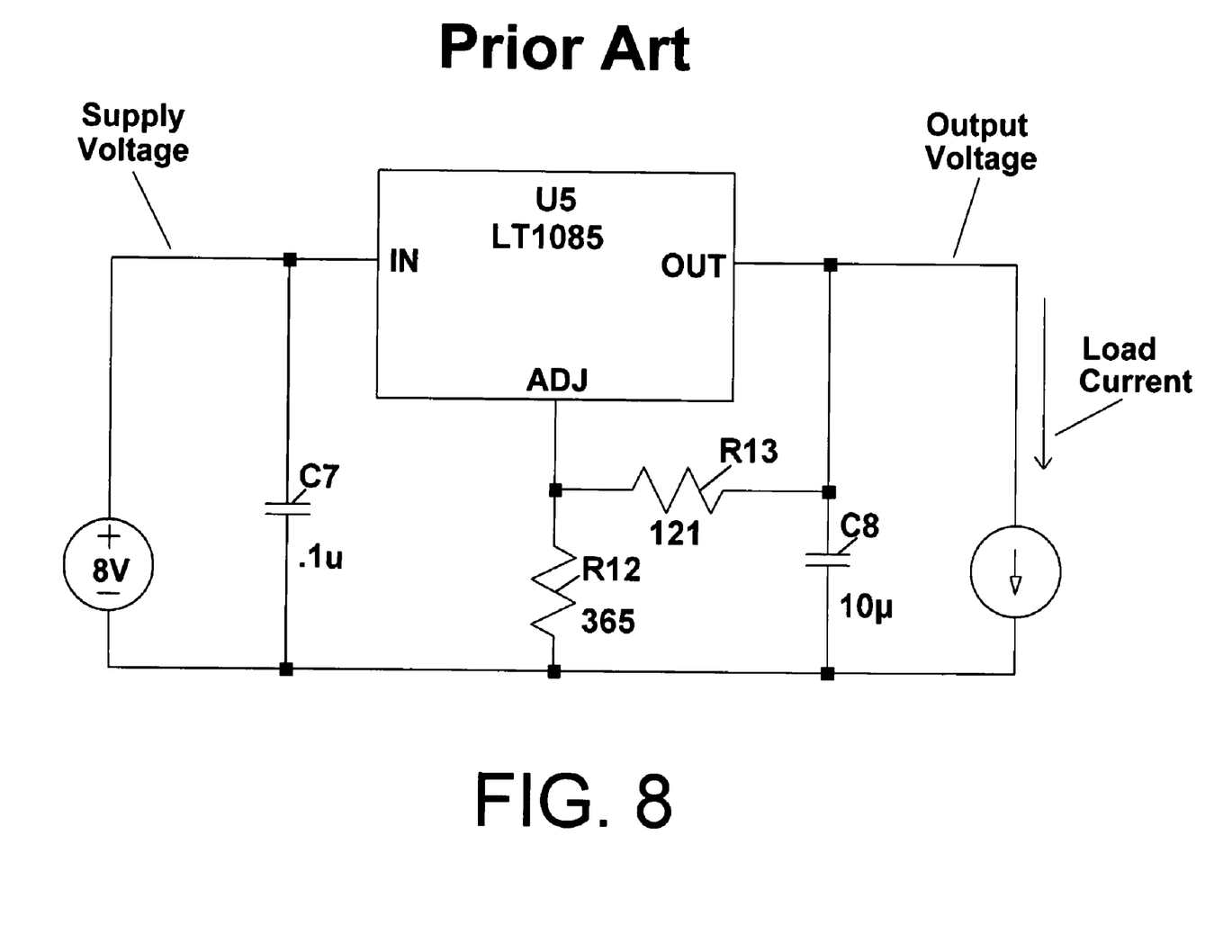
FIG. 8 shows a prior art voltage regulator.

FIG. 8 shows a Linear Technologies Corp. LT1085, a species of well known prior-art "three-terminal-regulator", connected according its manufacturer's recommendations. It is being exercised by a varying load current. The output of this prior-art regulator is shown in FIG. 10 (described below) to facilitate comparison of the performance of a prior-art regulator with the regulator according to this invention shown hereinbelow in FIG. 9.

Figure 9:
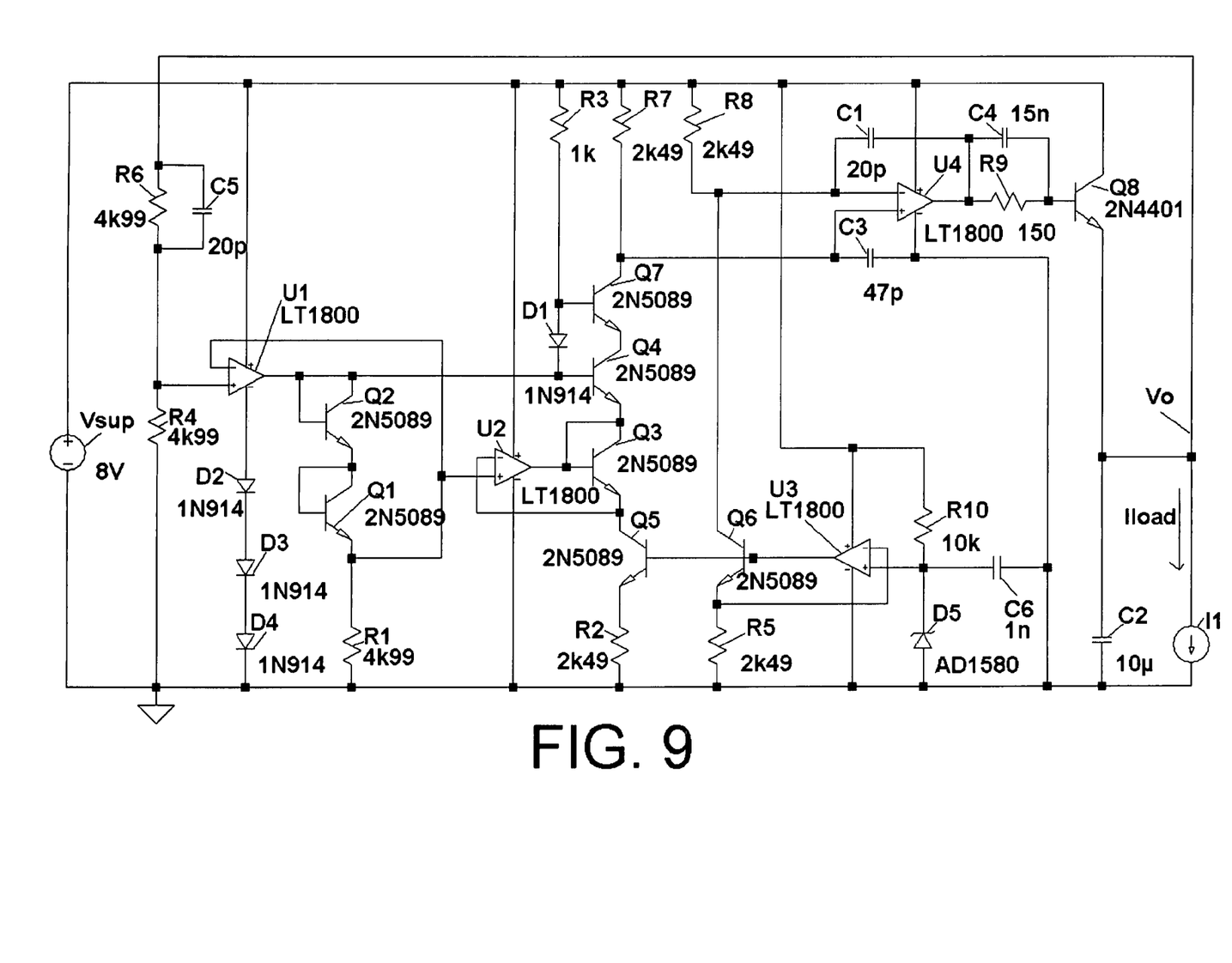
FIG. 9 is a schematic diagram of a practical voltage regulator comprising an exponentiating feedback control-loop according to the present invention.

FIG. 9 is the schematic diagram of a voltage regulator according to this invention driving a load that comprises capacitance. In this figure Output Voltage appears upon the emitter of BJT Q8, a common species of NPN transistor, which sources current to Load Current and also to C2 during a positive voltage excursion. Resistor R9 prevents excessive Q8 base current and C4 prevents the formation of a pole by the resistance of R9 and the possibly largely capacitive base current reflected through the beta of Q8 from C10. U4 and all the other operational amplifiers of this embodiment are Linear Technologies Corp. LT1800 parts, representing an average speed operational amplifier with good DC accuracy. The output of U4 drives the base of Q8 through R9. C3 bypasses the "+" input of U4 to common to prevent common mode oscillations, because the common mode rejection of U4 is finite. C1 prevents loss of feedback at frequencies too high properly to pass through the exponentiating circuitry to be described below. D5 an Analog Devices AD1580, a species of common 1.22 V bandgap shunt-reference, is fed by current from Supply Voltage through R10, and has its AC impedance lowered by C6. D5 is the reference voltage for this regulator. U3 drives the base of Q6, a common species of NPN transistor until the voltage at the top of R5 is substantially equal to that of D5. In so doing, it causes stable currents of about 500 μA to flow in both R2 and R5, which ultimately substantially flow in the collectors of Q5 and Q6. The collector current of Q6 drops across R8 a constant DC voltage that is scaled to represent the square of 5V, a desired output voltage. The actual output voltage is divided by R4 and R6 to accommodate the dynamic range of circuitry to be described below. C5 compensates the pole formed by R4, R6, and the input capacitance of U1. U1 sources current through diode-connected transistors Q2 and Q1 and R1 to cause the voltage at the top of R1 to equal the voltage at the top of R4. Since this voltage is proportional to actual output voltage, the current flowing through Q2 and Q1 is also proportional thereto. Therefore, the sum voltage across Q2 and Q1 is proportional to twice the logarithm of actual output voltage. The voltage at the emitter of Q1 is applied to diode-connected Q3, through which flows the approximately 500 μA collector current of Q5. Thus the voltage across Q3 is proportional to the logarithm of a constant. Since U2 holds its inputs substantially equal, the voltage between the collector of Q2 and the collector of Q3 is proportional to twice the logarithm of actual output voltage minus the logarithm of a constant. When this voltage is applied to the base and emitter of Q4, the current flowing therein becomes proportional to the antilog of the quantity twice the logarithm of actual output voltage minus the logarithm of a constant, which current is proportional to the square of actual output voltage. This current, correctly scaled, flowing in R7 drops thereacross a voltage proportional to the square of actual output voltage. Q7, D1, and R3 form a cascode stage to prevent inaccuracies of the current in Q4 due to the well-known Early-effect. U4, having its correctly-poled inputs connect to the bottoms of R7 and R8, does its utmost to annihilate any substantial voltage difference therebetween. In so doing U4 causes the actual output voltage, Vo, to track the desired voltage represented by the voltage of D5, in a similar manner to a prior-art voltage control loop, however in this embodiment and error voltage resulting in correction is proportional to the difference between the square of the desired voltage and the square of actual output voltage. This squares relationship proportions incremental feedback-loop response to the energy requirement of the capacitor having its voltage corrected. Whilst the logarithmic multiplier-divider of this embodiment is not particularly fast, it is inexpensive and adequate for many applications. Were more speed desired it would be better to use an AD734 multiplier to provide squaring function.

Figure 10:
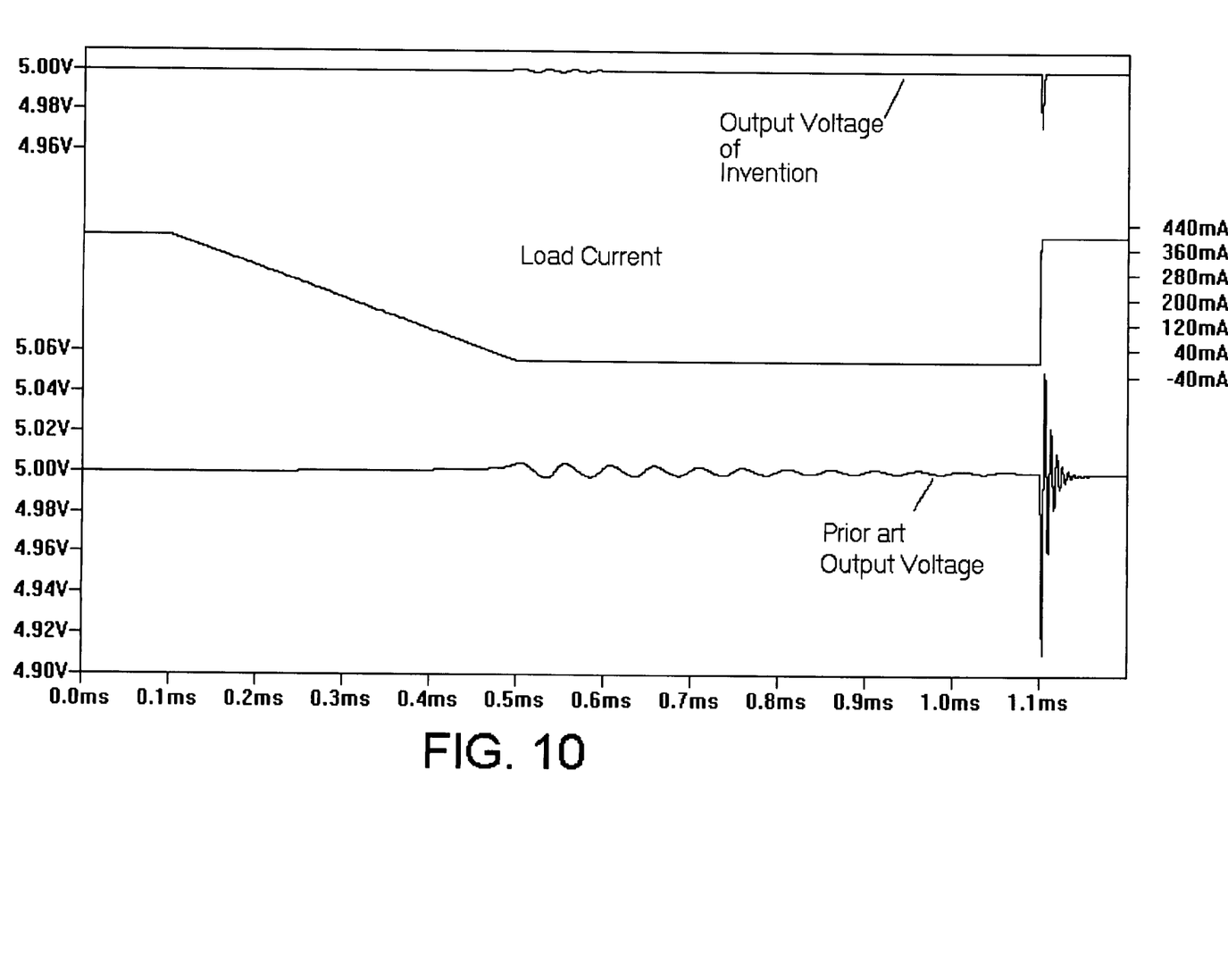
FIG. 10 shows the output voltage waveform of a practical voltage regulator, comprising an exponentiating feedback control-loop according the present invention, being exercised by a load change. For comparison, it also shows the response of the prior-art voltage regulator of FIG. 8.

FIG. 10 compares the response of the embodiment of FIG. 9 to the prior art embodiment of FIG. 8, with both being identically exercised by changing load current. The improvement in transient response in the trace named Output Voltage of Invention is superior to that of the trace named Prior art Output Voltage in a manner and to an extent similar to the superiority shown in FIG. 3 of the more generalized embodiment of this invention of FIG. 2 over the prior-art of FIG. 1.

Thus it can be seen that a practical embodiment of this invention is effective in achieving superior transient response when driving capacitive loads.

While FIG. 9 shows the exponentiating function to be implemented in analog circuitry, it alternative embodiments of the invention the input and output signals may be converted via A/D converters to digital signals and the exponentiating functions may be accomplished digitally through a dedicated arithmetic unit, general CPU, or other digital circuit. The digital embodiment has the advantage that the exponentiating factor or scaling of the signals may be readily adjusted via software commands.

While in the preceding examples the load has been capacitive it may also be applied to inductive loads. In the case of the inductive load the energy in the inductor is proportional to the square of the load current so a signal proportional to the load current is exponentiated and fed back to the input of amplifier.

It is understood that the invention is not limited to the disclosed embodiments, but on the contrary, is intended to cover various modifications and equivalent arrangements included within the spirit and scope of the appended claims. Without further elaboration, the foregoing will so fully illustrate the invention, that others may by current or future knowledge, readily adapt the same for use under the various conditions of service.

We claim:

1. A fed-back amplifier circuit for driving a substantially reactive load, comprising:
   an amplifier having a first input, a second input and an output;
   an exponentiating circuit generating an exponentiated feedback signal responsive to the voltage across, or current through, a substantially reactive load connected to the amplifier output wherein the exponentiated feedback signal is fed-back to the first input;
   an input signal fed into the second input;
   wherein the incremental change of energy required to change the voltage across, or current through, the load approximates the square of the incremental change of the voltage or current.

2. The amplifier circuit of claim 1 wherein the substantially reactive load is substantially capacitive.

3. The amplifier circuit of claim 1 wherein the substantially reactive load is substantially inductive.

4. The amplifier circuit of claim 1 wherein the exponentiating factor is approximately 2.0.

5. The amplifier circuit of claim 1 wherein the exponentiating factor is greater than 1.1.

6. A fed-back amplifier circuit for driving a substantially reactive load, comprising:
   an amplifier having a first input, a second input and an output, the output being connected to a substantially reactive load;
   an input signal
   a first squaring circuit for squaring the input signal;
   a second squaring circuit for squaring the output;
   a circuit for calculating the difference between the outputs of the first and second squaring circuits, the difference being fed into the first input of the amplifier.

7. The amplifier circuit of claim 6 wherein the substantially reactive load is substantially capacitive.

8. The amplifier circuit of claim 6 wherein the substantially reactive load is substantially inductive.

9. The amplifier circuit of claim 6 wherein the output signal is fed into the second amplifier input.

10. The amplifier circuit of claim 6 wherein the input signal is fed into the second amplifier input.

* * * * *